United States Patent [19]

St. John

[11] 4,306,131
[45] Dec. 15, 1981

[54] SOLID STATE TOUCH CONTROL SNAP SWITCH

[75] Inventor: Michael St. John, Essex Fells, N.J.

[73] Assignee: GTE Products Corporation, Stamford, Conn.

[21] Appl. No.: 163,447

[22] Filed: Jun. 26, 1980

[51] Int. Cl.³ .................. H01H 3/12; H01H 15/00
[52] U.S. Cl. ........................ 200/159 A; 200/16 R;
 200/16 D; 200/76; 200/153 LA; 200/252
[58] Field of Search ............ 200/159 A, 16 R, 16 A,
 200/16 C, 16 D, 76, 153 LA, 153 J, 153 B, 311,
 159 R, 252, 257, 260, 275, 282, 297, 314, 241,
 340, 329

[56] References Cited
U.S. PATENT DOCUMENTS

| | | | |
|---|---|---|---|
| 2,548,678 | 4/1951 | Obenour | 200/76 |
| 2,770,697 | 11/1956 | Kellett | 200/329 |
| 3,012,116 | 12/1961 | Boylan et al. | 200/16 R |
| 3,094,591 | 6/1963 | Hill | 200/16 R |
| 3,308,250 | 3/1967 | Field et al. | 200/257 |
| 3,888,807 | 6/1975 | Lockard | 200/16 R |
| 4,017,700 | 4/1977 | West | 200/159 R |
| 4,025,743 | 5/1977 | Oswald | 200/153 LA |
| 4,225,766 | 9/1980 | Pfeifer et al. | 200/314 |

OTHER PUBLICATIONS

"Sensitron", Publication by Leviton Manufacturing Co., Inc., 59–25, Little Neck Pkwy., Little Neck, New York 11362.

Primary Examiner—Willis Little
Attorney, Agent, or Firm—William R. McClellan; David M. Keay

[57] ABSTRACT

A switch, typically one used as a wall switch for the control of lighting in residences and commercial establishments, has a handle which is operable between a full off position in which the switching circuit is completely disconnected from a source of electrical power, and a use position in which the handle, while remaining stationary, becomes a touch-type control for operating the switch circuit between its "on" and "off" modes.

10 Claims, 6 Drawing Figures

U.S. Patent  Dec. 15, 1981  Sheet 1 of 2  4,306,131
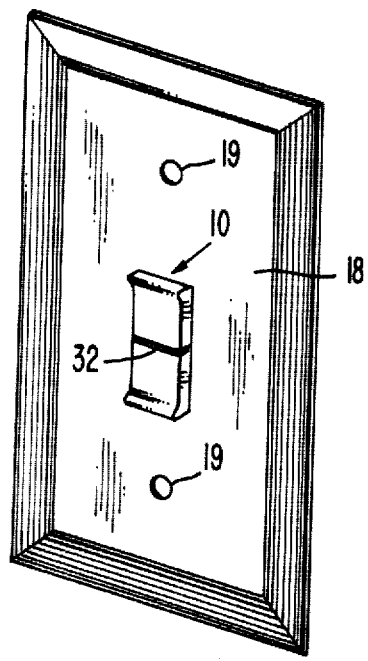
_Fig_1_
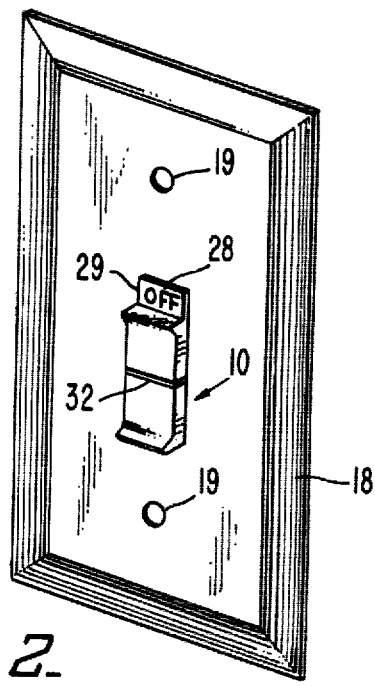
_Fig_2_
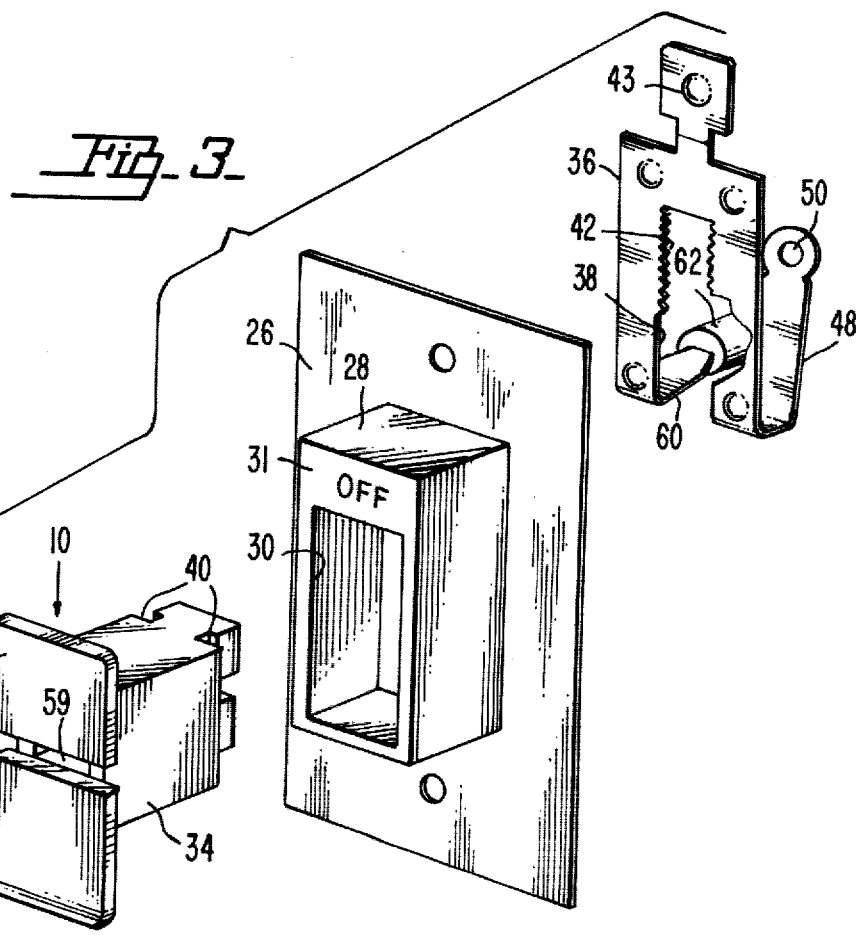
_Fig_3_

SOLID STATE TOUCH CONTROL SNAP SWITCH

BACKGROUND OF THE INVENTION

1. Field of the Invention

The invention relates generally to the field of electrical wiring devices, and more particularly to switches such as are used in controlling room lighting, in residential and commercial buildings. In a more particular sense, the invention relates to those switches which are of the solid state, touch-controlled type, that is to say, switches in which a touch of a stationary handle plate with one's finger is adapted to close the controlled circuit, and wherein the plate is again touched, to open the circuit.

2. Description of the Prior Art

It is well known to provide touch control switching circuits, wherein an exposed plate is adapted to be touched by one's finger, to cause a circuit to be closed to a source of electrical power, for any of various uses. It is, for example, very common to provide touch plates wherein contact with the plate by one's finger produces an electronic response in which the user becomes part of an electrical circuit adapted through suitable electrical circuitry to close or open a switching circuit to a source of electrical power.

Switching circuits of this type have comparatively recently come into use as a means for controlling room lighting, in place of the conventional toggle type or push type wall switches that have been in vogue for many years. It is, indeed, known to provide circuits of this type for use in dimming circuit applications, wherein the positioning of the finger upon the touch plate, and holding of the finger thereon, operates the dimming circuit from full off to full on, with finger removal at any intermediate point being adapted to maintain or select a particular operating level. A problem has arisen in connection with touch-type switching devices of the character described, in that the capability of producing and selling such devices commercially requires, as a practical matter, that the switching devices be listed by Underwriters Laboratories. This organization, however, requires compliance with certain established, rigid standards, for safety purposes, before it will list a switching device for a particular use and at a particular rating.

One of the requirements established by Underwriters Laboratories for switches of the character described, is a requirement for effecting a true separation of the electrical conductors that connect the switching circuit to a source of electrical power. This, in other words, means that a mechanical switch must be provided, in association with the touch-type on-off control function, whereby the switch can be completely disconnected from the source of electrical power. In the open condition of the switch, it is necessary to pass a high voltage withstand test established by Underwriters Laboratories, and as a result, a mechanical switch that will truly pass the test must be incorporated within the wiring device.

The problem that results as a practical matter, however, is that the supplementary electrical switch function has heretofore been achieved only through the provision of unsightly, exposed appendages to the wiring device, and this of course detracts markedly from the capability of the manufacturer to sell the switch product. A touch-type control switch, in the final analysis, is generally selected not only for reliability but also because of its aesthetic value, and it is thus readily seen that providing a mechanical switching device, fully exposed as it must be in order to permit its ready operation, has severely hampered the ability of the switch manufacturing industry, in developing a good commercial market for switches of this type.

SUMMARY OF THE INVENTION

Summarized briefly, the present invention incorporates both the mechanical, main, disconnect function requiring physical movement of contacts between open and closed positions, and the regular-use touch-type on-off function utilizing a stationary touch plate, in a single handle or touch plate element, thus to retain for the switch a highly attractive aesthetic value so far as the exposed portions thereof are concerned, while at the same time satisfying fully the rigid standards established by such organizations as Underwriters Laboratories.

To this end, the switch comprised in the present invention utilizes a solid state touch control circuit, which in and of itself is already well known, in association with a plate-like handle having a slidable movement between a first position which can be termed a main control disconnect position, and a second position in which the switch closes the circuit to a source of power, and thereafter can be touched while stationary to operate the solid state circuit between energized and de-energized conditions.

BRIEF DESCRIPTION OF THE DRAWINGS

While the invention is particularly pointed out and distinctly claimed in the concluding portions herein, a preferred embodiment is set forth in the following detailed description which may be best understood when read in connection with the accompanying drawings, in which:

FIG. 1 is a perspective view illustrating a switch according to the present invention, as it appears when mounted upon a wall plate, the switch being shown in its use position in which a touch of the handle by one's finger will operate a switching circuit to on or off positions;

FIG. 2 is a view similar to FIG. 1 in which the switch handle has been moved to its main control or disconnect position, in which it disconnects the switching circuit entirely from a source of power to prevent touch control of the circuit;

FIG. 3 is an exploded perspective view showing the main components of the switch handle and contact assembly;

DESCRIPTION OF THE PREFERRED EMBODIMENT

Figure 4:
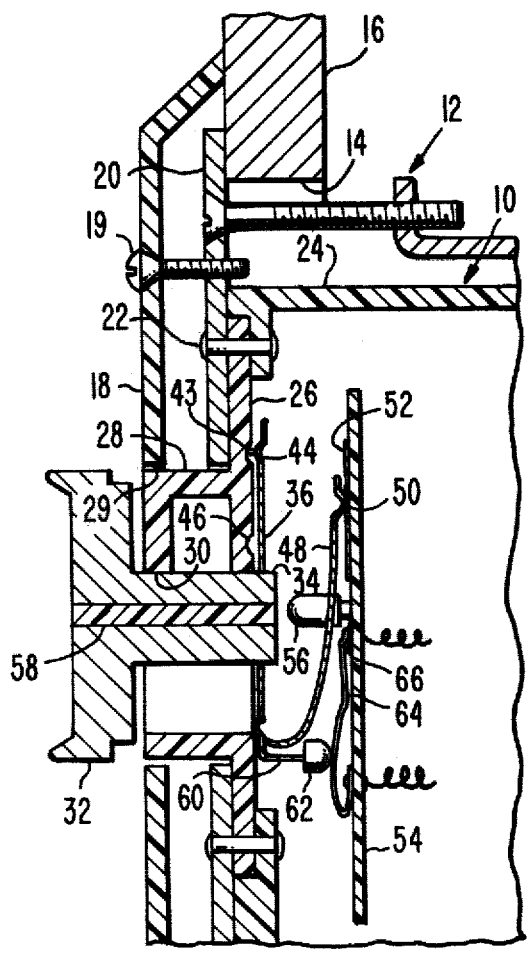
FIG. 4 is a fragmentary, enlarged, longitudinal sectional view through the switch, the switch components being shown in their touch control or normal use position.

The present invention is mainly concerned with the concept of incorporating the mechanical, main disconnect switch function in the same handle or touch plate as that used as a touch control element for the solid state switch circuit when the circuit is connected to a source of electrical power. For the purpose of promoting clarity of understanding of the disclosure, hereinafter the switch position and function, in which the wiring device is completely and mechanically disconnected from a source of electrical power, will be termed the "disconnect" position; and the touch plate position in which the solid state circuit is connected to a source of electrical power, and is opened or closed responsive to a touch of the plate, will be termed the "use" position.

The physical structure illustrated in the drawings, and described hereinafter, will be understood as merely comprising one, presently preferred embodiment of this concept.

In the drawings, the switch comprising the present invention has been generally designated 10, and as shown in FIG. 4, is mounted within a conventional outlet box 12 mounted in back of an opening 14 formed in the room wall 16.

A wall plate 18, basically conventional in configuration, covers all portions of the switch and outlet box, when mounted in position over the wall opening 14, leaving exposed only the handle or touch plate of the invention. As is usual, the wall plate is provided with spaced apertures receiving wall plate mounting screws 19, which are threaded into openings provided in the opposite end portions of a metal mounting strap 20 which constitutes one of the componets of the switch 10. Strap 20 is riveted or otherwise secured as at 22, to the housing 24 of the switch.

A rectangular, flat plate 26 of electrical insulation material (see FIGS. 3 and 4) is provided as a cover for the body of the switch housing, and may be of a molded plastic material in a typical embodiment of the invention. Plate 26, as seen from FIG. 4, is secured between the housing body and the mounting strap 20, by the rivets or equivalent fastening elements 22.

As shown to particular advantage in FIG. 3, integrally molded upon and projecting forwardly from the flat body portion of the plate 26 is a rectangular boss 28, which is formed with an opening 30 over substantially its full length. Opening 30 in the illustrated embodiment terminates short of the upper edge of the boss 28, to provide a flat surface 31 on which there may be printed, in a commercial embodiment, the word "off". This legend or indicium is intended to represent, visually, the switch condition in which there is a complete disconnection from the source of electrical power, in accordance with requirements of Underwriters Laboratories, building codes, or other municipal or other private associations that establish safety standards for devices of this type.

Designated at 32 is the operating element of the switch. This element is a handle in the sense that it can be grasped, and indeed is grasped, for the purpose of moving it between a disconnect and a use position. It is, also, a touch plate, in the sense that when in its use position and there left stationary, it is touched to energize the load, and is touched again to de-energize the load.

Operating element 32, in the illustrated embodiment, is provided with a rearwardly projecting stem 34 of rectangular cross section (see FIG. 3), said stem projecting through the opening 30 and extending at its distal extremity beyond the plane of the plate 26 (see FIG. 4). On the distal end portion of the stem 34, there is mounted a metallic clip 36 of spring metal material (see FIG. 3), which as shown may have an elongated, relatively wide, longitudinally centrally extending slot 38. The distal portion of the stem 34 is provided at opposite sides thereof with grooves 40 (see FIG. 3), accommodating the side edge portions of the slot 38, so that the clip can be slipped onto the stem 34, where the clip will be secured against accidental disengagement from the stem, through the provision of serrations 42 formed in the opposite edges of the slot 38. The serrations bite into the material of the stem 34, thus to secure the clip to the stem for movement with the operating handle between its disconnect and use positions.

As shown in FIG. 4, the clip 36 is formed, at one end, with a detent 43 (see also FIG. 3), said detent being adapted to engage in one or the other of spaced detent-receiving recesses 44, 46 (FIG. 4) formed in the underside of the plate 26. The recesses and the detent are for the purpose of indexing the handle or operating element 32 between its disconnect and use positions, respectively.

Again referring to FIG. 3, it may be noted that the clip 36 in the illustrated embodiment is formed of sheet metal material, and at the end thereof opposite the detent 43, is folded upon itself at one side of the slot 38 to provide a contact spring 48 terminating at its distal end in a spring arm contact 50. Contact 50 is urged against an elongated contact plate 52 provided upon the surface of a printed circuit board 54, which board contains a conventional solid state touch-type switch circuit. The solid state circuit is not illustrated herein, because it is a conventional chip or circuit board capable of being purchased on the open market. For example, a chip of this type may be purchased from Siemens Corporation Components Group, 186 Wood Ave. S., Iselin, N.J. 08830.

Figure 5:
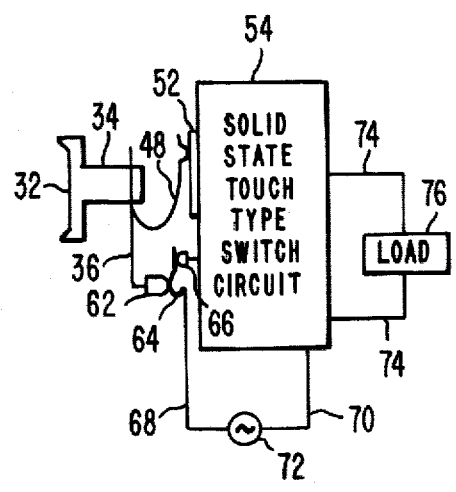
FIG. 5 is a schematic view illustrating the circuitry with the control elements in their FIG. 1, use position.

It will be understood at this point that in the use position of the operating element 32, shown in FIGS. 1, 4, and 5, the operating element, while stationary, can be touched by one's finger, so that in effect the user becomes part of an electronic circuit, whereby the circuit 54 will be caused to change its mode, that is to say, if the circuit is open it will be closed, or if closed it will be opened. Thus, assuming the circuit to be connected to a source of electrical power, the controlled load will be either energized or de-energized correspondingly.

The energy required to change the configuration or electronic mode of the circuit 54 is transmitted, as will be understood, through stem 34, contact spring 48, and contact plate 52.

Optionally, the switch can be of the illuminated type, and in this event there may be provided an LED (light-emitting diode) 56. Diode 56 would be disposed in the use position of the operating element 34, in line with a translucent operating element insert 58 (see FIGS. 3 and 4), which fits through an opening 59 formed in the body of the operating element, and extends the full length of the stem as shown in FIG. 4, thus to permit light to be transmitted through the insert 58 for visual observation by a user.

Also formed integrally upon the clip 36, at the other side of the slot 38 (see FIG. 3) is a relatively short, rearwardly projecting disconnect switch arm 60, terminating at its distal end in a head 62 of electrically insulative material. The head is insulated from clip 36, and as shown in FIG. 4, head 62 is adapted to cammingly engage a spring arm 64 comprising one contact element of a main disconnect switch means. Arm 64 may as shown be secured to the surface of the chip or printed circuit element 54. Arm 64, when biased from its normal position by head 62, engages a contact button 66, to connect the touch-type switching circuit to a source of electrical power. Thus, referring to FIGS. 5 and 6, it may be noted that in one arrangement that can advantageously be used, the switch arm 64 is secured to one side 68 of a power circuit, the other side of which has been designated 70, the opposite sides of said circuit extending from a source of electrical power such as a 110 volt AC current source 72.

Designated at 74 are conductors extending from the solid state circuit 54, to the controlled load 76.

Figure 6:
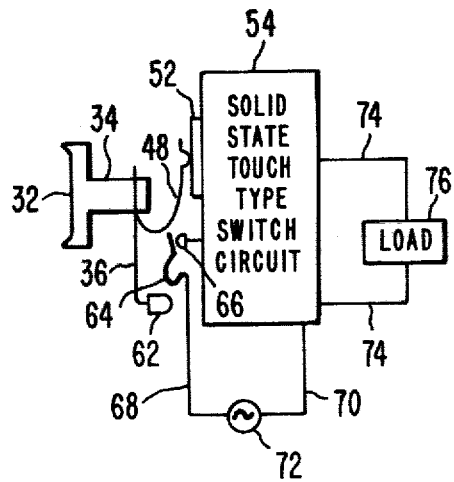
FIG. 6 is a schematic view similar to FIG. 5 in which the control elements have been moved to their main disconnect or inoperative position as in FIG. 2.

In use of the device, reference may first be had to FIGS. 2 and 6. As required by Underwriters Laboratories and as may also be required by other municipal or private organizations concerned with the safety of electrical equipment, the switch in FIGS. 2 and 6 is physically moved to a position providing complete disconnection of at least one side of the power circuit from the solid state touch-type switch circuit. Thus, the operating element 32 has been slid downwardly within opening 30 of the boss 28, and as a result, has physically moved the button 62 off the arm 64. Arm 64, under its inherent resiliency, moves away from the button 66. Button 66 extends into the circuit 54, to connect the circuit to one side of the power circuit 72.

Under these circumstances, the switch 10 is completely disconnected from the power circuit. Disconnection of the switch from both sides of the power circuit is not required, so long as the switch is disconnected from the "hot" side thereof, this being the side 68 shown in FIG. 6, and is mechanically disconnected to and extends sufficiently to permit the switch to withstand the high voltage tests applied by Underwriters Laboratories. By assuring sufficient spacing between arm 64 and button 66 in the disconnect position, no problem is encountered in meeting these rigid safety standards.

It may be noted from FIG. 6, that in these circumstances, the switch arm 48 simply slides along the surface of the contact plate 52 of the solid state load control circuit, while remaining in full physical and electrical contact therewith. This does not detract from the safety aspects of the device, since as noted above, the solid state circuit is disconnected from the source of electrical power.

In the illustrated embodiment, when the operating element 32 of the switch is in the disconnect position, shown as the lower position in FIG. 2, the word "off", provided upon the upper portion of the boss 28 on surface 31, is now exposed above the operating element. This provides the user with a clear, visual indication that the entire switch has been safely disconnected from the source of electrical power. Also, the LED 56 is de-energized, since it is part of the solid state touch control circuit and hence is also disconnected from the source of electrical power, so that no light is visible through the insert 58 of the operating element 32.

Assume now that the user desires to operate the switch 10 to its use position. In these circumstances, one simply shifts the operating element 32 upwardly, in the same manner as one would operate the handle of an ordinary slide switch. Now the operating element is in its upper position shown in FIGS. 1 and 5, and also in FIG. 4. In these circumstances, the word "off" is covered by the upper portion of the operating element. Also, button or head 62 has now cammingly engaged the switch arm 64, and has biased it against its inherent resiliency, into engagement with the contact button 66, thus connecting the circuit 54 to the source of electrical power 72 (see FIGS. 4 and 5).

In this position of the operating element 32, the distal end of the switch arm 48 simply slides along the contact plate 52, while remaining in firm engagement therewith.

At this time, the light emitting diode 56 is registered with the insert 58, and is also energized by reason of now being connected to the source of electrical power, thus to indicate to the user that the switch device is in its use position. One need only touch the plate 32 while it is in its upper position, the plate 32 being left stationary at this time. Touching the plate or operating element 32 in this way produces a response in the solid state circuit, effective to cause power to flow to and to energize the load 76. Another touch of the operating element reverses the mode, that is, the circuit 54 now responds to de-energize load 76.

The load 76 can be turned on or off, of course, with the plate element 32 being left stationary in its upper, use position, shown in FIGS. 1, 4, and 5. It may be left there as long as desired. However, the user is enabled to disconnect the entire circuitry from the source of electrical power, by sliding the operating element 32 downwardly. Now, the element is in its lower position as shown in FIGS. 2 and 6, opening the main disconnect switch means represented by switch arm 64 and head 66, to produce the required mechanical disconnection of the solid state touch control circuitry from the source of electrical power schematically represented at 72.

This is achieved, as will be noted, without detracting from the aesthetic appearance of the device, and no separate, mechanical, exposed switch is necessary in the illustrated arrangement, since the operating element discharges the functions both of a mechanical switch handle used for complete disconnection from the source of power, and the function of a touch plate used as an on-off control for a solid state circuit employed for the purpose of controlling room lighting or for any other related purpose.

While particular embodiments of this invention have been shown in the drawings and described above, it will be apparent that many changes may be made in the form, arrangement, and positioning of the various elements of the combination. In consideration thereof it should be understood that preferred embodiments of this invention disclosed herein are intended to be illustrative only and not intended to limit the scope of the invention.

I claim:

1. In a switch of the touch-type including an operating element which, in response to being touched while remaining stationary relative to a switch housing, produces an electrical response in a control circuit, said control circuit being operative to alternately energize and de-energize an electrical load in response to said operating element being successively touched, the improvement that comprises:

(a) said operating element being mounted in position to be accessible to a user and being mounted for movement relative to said switch housing between a use position, in which said operating element produces an electrical response in said control circuit in response to being touched while remaining stationary relative to said switch housing, and a disconnect position; and (b) means actuated by movement of the operating element to said disconnect position, for mechanically disconnecting the control circuit from a source of electrical power, whereby said operating element and said control circuit are totally inoperative in said disconnect position.

2. The improvement of claim 1, wherein said means actuated by movement of the operating element includes cooperating switch members.

3. The improvement of claim 1 wherein said means actuated by movement of the operating element includes switch contacts which are closed to connect the control circuit to said source of electrical power when the operating element is in its use position, and which move to open position responsive to shifting of the operating element to the disconnect position thereof.

4. The improvement of claim 1 including a control switch element movable with the operating element, and adapted to provide a connection between the operating element and said control circuit in both the use and the disconnect positions of the operating element.

5. The improvement of claim 1 in which the operating element is slidably movable between opposite extreme positions.

6. The improvement of claim 5 in which the operating element is in its use position in one of said extreme positions and is in its disconnect position in the other of its extreme positions.

7. The improvement of claim 1 in which said means actuated by movement of the operating element to its disconnect position, comprises cooperating switch elements controlling flow through at least one side of the power circuit.

8. The improvement of claim 7 in which said cooperating switch elements, in the use position of the operating element, are biased into engagement with each other responsive to said movement of the operating element to its use position.

9. The improvement of claim 8 in which said cooperating switch elements shift into a spaced relationship as a response to movement of the operating element to its disconnect position, and in said spaced relationship wholly disconnect the control circuit from the source of electrical power.

10. The improvement of claim 9 in which the operating element is in the form of a relatively flat plate, slidably mounted for movement between its use and disconnect positions.

* * * * *